United States Patent
Kang

(10) Patent No.: US 8,040,268 B2
(45) Date of Patent: Oct. 18, 2011

(54) DATA READOUT SYSTEM HAVING NON-UNIFORM ADC RESOLUTION AND METHOD THEREOF

(75) Inventor: Tzung-Hung Kang, Hsin-Chu Hsien (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/948,775

(22) Filed: Nov. 18, 2010

(65) Prior Publication Data

US 2011/0063153 A1    Mar. 17, 2011

Related U.S. Application Data

(63) Continuation of application No. 12/015,473, filed on Jan. 16, 2008, now Pat. No. 7,859,441.

(60) Provisional application No. 60/911,276, filed on Apr. 11, 2007.

(51) Int. Cl.
*H03M 1/36*    (2006.01)

(52) U.S. Cl. .................................. 341/159; 341/155

(58) Field of Classification Search .................. 341/159, 341/158, 118, 138, 120, 155, 156, 172; 375/232
See application file for complete search history.

(56) References Cited

U.S. PATENT DOCUMENTS

| | | | |
|---|---|---|---|
| 3,637,161 A | 1/1972 | Baur | |
| 5,162,994 A | 11/1992 | Torres | |
| 5,537,114 A | 7/1996 | Auffret | |
| 5,793,556 A | 8/1998 | Freitas | |
| 6,778,122 B2 | 8/2004 | Lien | |
| 6,798,370 B1 | 9/2004 | Nagano | |
| 6,803,871 B2 | 10/2004 | Mallinson | |
| 6,977,603 B1 | 12/2005 | Barna | |
| 7,859,441 B2 * | 12/2010 | Kang | ............ 341/138 |
| 2006/0077090 A1 | 4/2006 | Schimper | |
| 2007/0063882 A1 | 3/2007 | Feng | |
| 2007/0147490 A1 | 6/2007 | Okamoto | |

FOREIGN PATENT DOCUMENTS

| | | |
|---|---|---|
| JP | H685675 A | 3/1994 |
| JP | H6508972 A | 10/1994 |
| JP | H9219643 A | 8/1997 |
| JP | 2003101411 A | 4/2003 |
| JP | 200448327 A | 2/2004 |

\* cited by examiner

*Primary Examiner* — Joseph Lauture

(74) *Attorney, Agent, or Firm* — Winston Hsu; Scott Margo

(57) ABSTRACT

A data readout system with non-uniform resolution has a pick up head for reading data stored in an optical disc and generating an analog signal, a reference voltage unit for producing a plurality of reference voltage levels, wherein voltage differences between two adjacent reference voltage levels are not all the same, a plurality of comparators for comparing the reference voltage levels with the analog signal and generating comparison results, and an encoder for encoding the comparison results into a digital signal.

18 Claims, 8 Drawing Sheets

| Normal | Nonlinear quantized | Normal | Nonlinear quantized | Normal | Nonlinear quantized | Normal | Nonlinear quantized |
|---|---|---|---|---|---|---|---|
| 0 | 0 | 32 | 33 | 64 | 64 | 96 | 97 |
| 1 | 3 | 33 | 33 | 65 | 65 | 97 | 97 |
| 2 | 3 | 34 | 33 | 66 | 66 | 98 | 97 |
| 3 | 3 | 35 | 36 | 67 | 67 | 99 | 100 |
| 4 | 3 | 36 | 36 | 68 | 68 | 100 | 100 |
| 5 | 3 | 37 | 36 | 69 | 69 | 101 | 100 |
| 6 | 8 | 38 | 39 | 70 | 70 | 102 | 104 |
| 7 | 8 | 39 | 39 | 71 | 71 | 103 | 104 |
| 8 | 8 | 40 | 39 | 72 | 72 | 104 | 104 |
| 9 | 8 | 41 | 42 | 73 | 73 | 105 | 104 |
| 10 | 8 | 42 | 42 | 74 | 74 | 106 | 104 |
| 11 | 13 | 43 | 43 | 75 | 75 | 107 | 109 |
| 12 | 13 | 44 | 44 | 76 | 73 | 108 | 109 |
| 13 | 13 | 45 | 45 | 77 | 77 | 109 | 109 |
| 14 | 13 | 46 | 46 | 78 | 78 | 110 | 109 |
| 15 | 13 | 47 | 47 | 79 | 79 | 111 | 109 |
| 16 | 18 | 48 | 48 | 80 | 80 | 112 | 114 |
| 17 | 18 | 49 | 49 | 81 | 81 | 113 | 114 |
| 18 | 18 | 50 | 50 | 82 | 82 | 114 | 114 |
| 19 | 18 | 51 | 51 | 83 | 83 | 115 | 114 |
| 20 | 18 | 52 | 52 | 84 | 85 | 116 | 114 |
| 21 | 23 | 53 | 53 | 85 | 85 | 117 | 119 |
| 22 | 23 | 54 | 54 | 86 | 85 | 118 | 119 |
| 23 | 23 | 55 | 55 | 87 | 88 | 119 | 119 |
| 24 | 23 | 56 | 56 | 88 | 88 | 120 | 119 |
| 25 | 23 | 57 | 57 | 89 | 88 | 121 | 119 |
| 26 | 27 | 58 | 58 | 90 | 91 | 122 | 124 |
| 27 | 27 | 59 | 59 | 91 | 91 | 123 | 124 |
| 28 | 27 | 60 | 60 | 92 | 91 | 124 | 124 |
| 29 | 30 | 61 | 61 | 93 | 94 | 125 | 124 |
| 30 | 30 | 62 | 62 | 94 | 94 | 126 | 124 |
| 31 | 30 | 63 | 63 | 95 | 94 | 127 | 127 |

DATA READOUT SYSTEM HAVING NON-UNIFORM ADC RESOLUTION AND METHOD THEREOF

CROSS REFERENCE TO RELATED APPLICATIONS

This application is a continuation application of applicant's earlier application Ser. No. 12/015,473, filed on Jan. 16, 2008 and included herein by reference. Besides, the U.S. application Ser. No. 12/015,473 claims the benefit of U.S. Provisional Application No. 60/911,276, filed on Apr. 11, 2007 and included herein by reference.

BACKGROUND

The invention relates to an analog-to-digital converter, and more particularly, to an analog-to-digital converter used in a data readout system.

In modern circuit design, high speed analog-to-digital converter is important because of the need for transferring massive information from analog signals into digital signals. A Flash ADC is commonly used for converting analog signals into digital signals at a high speed. The high speed of a Flash ADC is achieved by parallel operation. Traditionally, $2^n-1$ comparators are used in an n-bit Flash AD converter. The $2^n-1$ comparators operate simultaneously and then the comparison results are encoded into an n-bit digital output. However, comparators occupy a large area in a Flash AD converter. The higher the resolution requirement is, the larger the area would be. For a data readout system, such as an optical drive, a great amount of data needs to be read from an optical disc and transferred into digital formats very fast and reliable. More comparators could increase resolution and accuracy, but suffer from large chip area and high cost. Thus, there is a need for a new analog-to-digital circuit with high accuracy, high speed, but with smaller area and lower cost.

SUMMARY

Therefore, one of the objectives of the present invention is to provide a data readout system having non-uniform ADC resolution and a method thereof. The range of an analog input signal carrying most information could be quantized using a higher resolution, and the range of the analog input signal carrying less information could be quantized using a lower resolution to therefore decrease the number of comparators required in the data readout system while the accuracy of data readout is maintained.

According to the claimed invention, an exemplary embodiment of a data readout system comprises a pick up head for reading data stored in an optical disc and generating an analog signal; a reference voltage unit for producing a plurality of reference voltage levels, wherein at least two of voltage differences of adjacent reference voltage levels are different; a plurality of comparators for comparing the reference voltage levels with the analog signal and generating comparison results; and an encoder for encoding the comparison results into a digital signal.

According to the claimed invention, an exemplary embodiment of a method for processing a signal comprises providing a plurality of reference voltage levels, arranged by voltage level in a chain, wherein at least two voltage differences of adjacent reference voltage levels are different; and comparing an analog input signal with the reference voltage levels to generate comparison results.

According to the claimed invention, another exemplary embodiment of a method for converting an analog signal into a digital signal comprises providing a non-linear magnitude transfer characteristic; generating an analog input signal from accessing a storage device; amplifying the analog input signal according to the non-linear magnitude transfer characteristic to generate an output signal; and converting the output signal into the digital signal.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 illustrates a table showing an example of the output code of a 7-bit ADC with and without nonlinear quantization characteristic.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
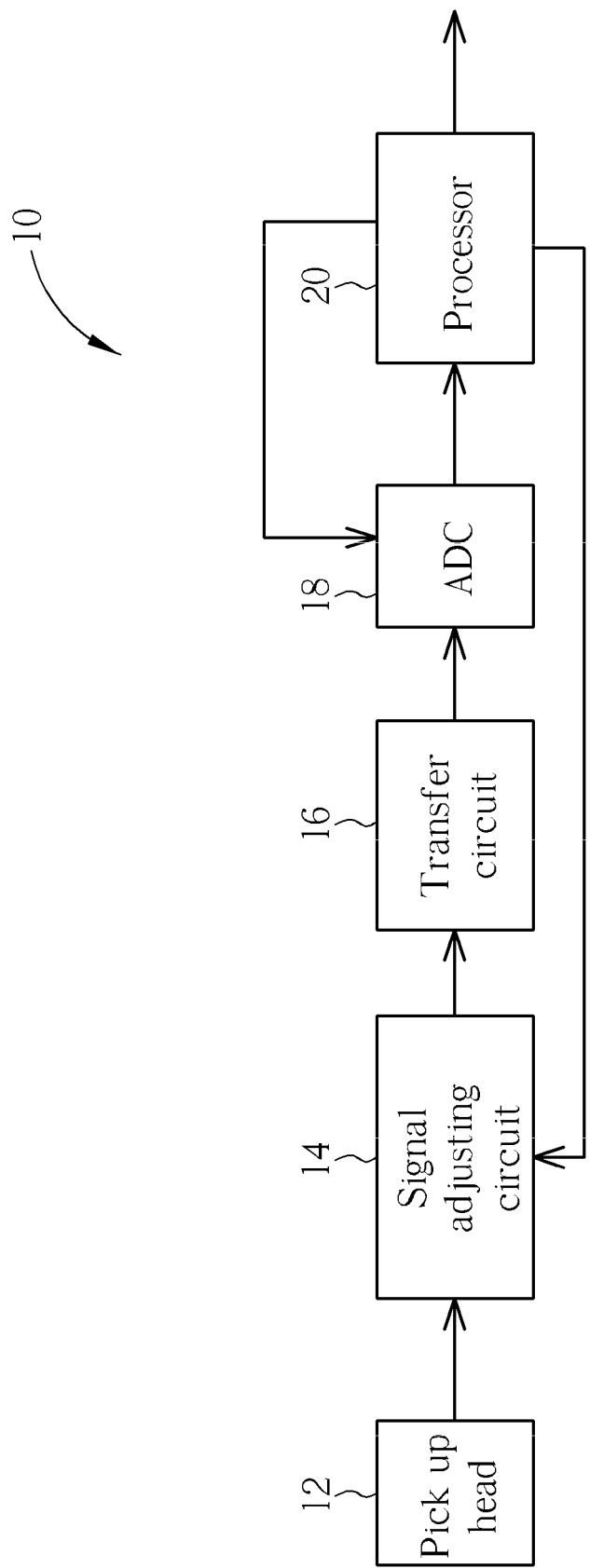
FIG. 1 is a diagram of a data readout system according to an exemplary embodiment of the present invention.
Figure 2:
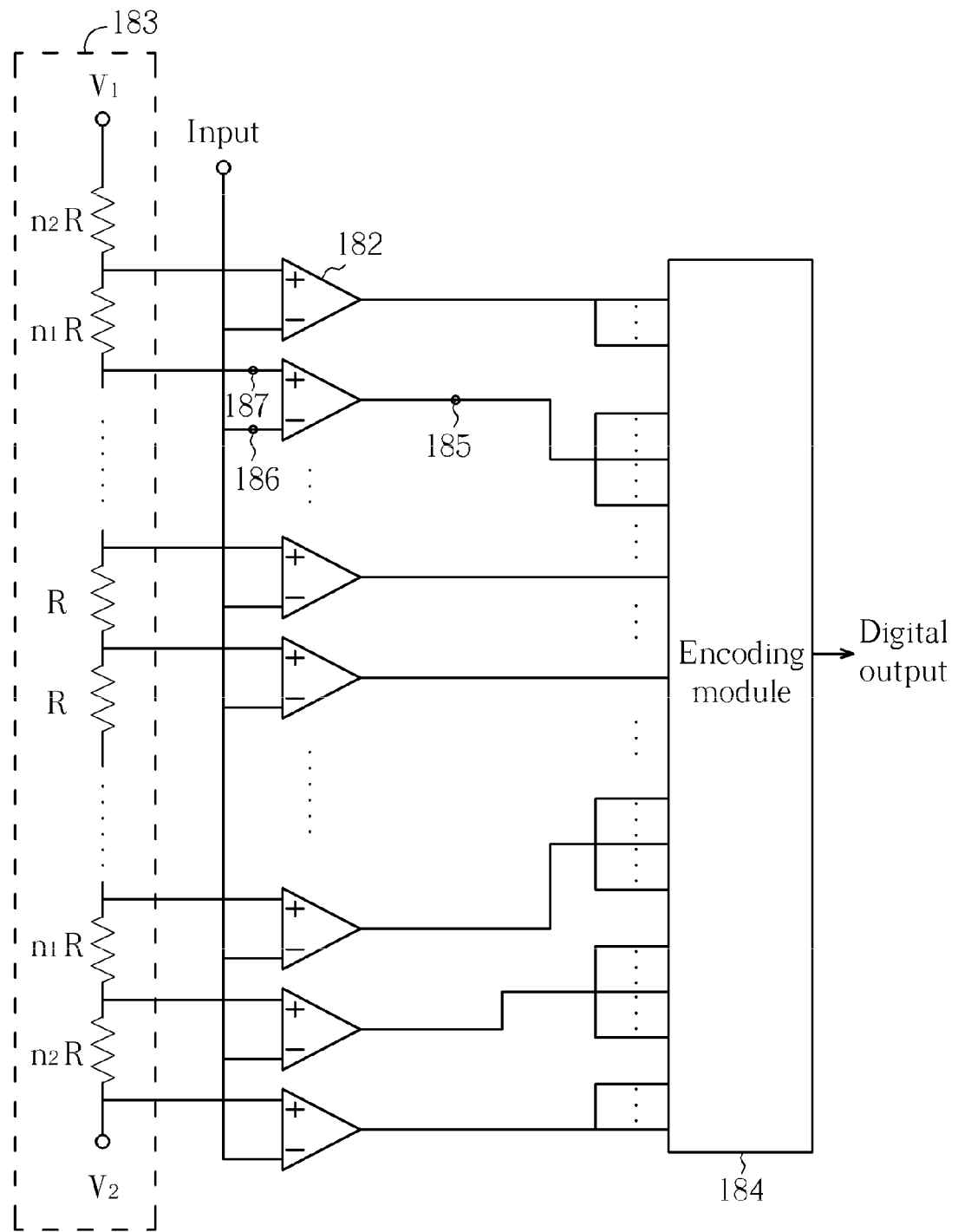
FIG. 2 is a detailed diagram of an ADC shown in FIG. 1 according to an exemplary embodiment of the present invention.

Please refer to FIG. 1 in conjunction with FIG. 2. FIG. 1 illustrates a data readout system 10 according to an exemplary embodiment of the present invention, and FIG. 2 is a detailed diagram of an ADC 18 shown in FIG. 1 according to an exemplary embodiment of the present invention. The data readout system 10 comprises a pick up head 12, a signal adjusting circuit 14, a transfer circuit 16, an ADC 18 with non-uniform resolution, and a processor 20. As shown in FIG. 2, the ADC 18 comprises a reference voltage unit 183, a plurality of comparators 182, and an encoding module 184 coupled to the output nodes 185 of each comparator 182. The reference voltage unit 183 produces a plurality of reference voltage levels. In this embodiment, the reference voltage unit 183 is implemented by a reference ladder comprising a plurality of resistors coupled in series and coupled between a first reference voltage level $V_1$ and a second reference level $V_2$. In other embodiments, components other than resistors can also be used to implement reference voltage unit 183. For example, capacitors in combination with resistors can form a reference voltage unit 183. Each comparator 182 comprises an input node 186 for receiving an analog input signal output from the transfer circuit 16, a reference node 187 for receiving a reference voltage, and an output node 185 for outputting a result of comparing the analog input signal and the reference voltage. The resistors are respectively coupled to the reference nodes 187 of the comparators 182 in order to produce different reference voltages, and not all the resistors have the same impedance value, to thereby define at least a first range corresponding to a first conversion resolution and a second range corresponding to a second conversion resolution different from the first conversion resolution. The encoding module 184 is utilized for producing a digital signal according to comparison results of the comparators 182.

Figure 3:
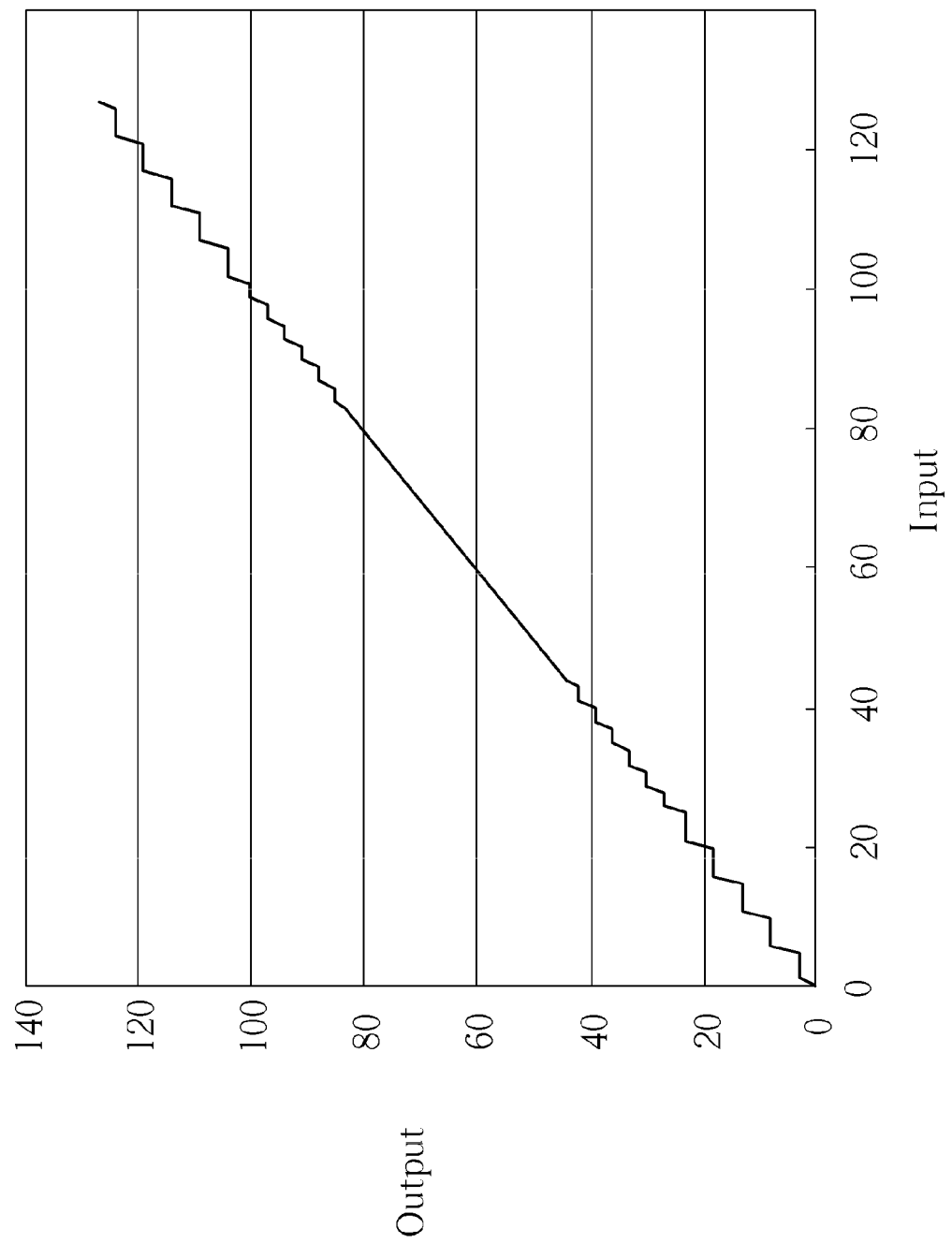
FIG. 3 is the transfer function of the non-uniform resolution 7-bit ADC according to an exemplary embodiment of the present invention.

The design rule of the resistor chain of the ADC 18 is to let the range of the analog input signal carrying most information be quantized using a higher resolution, or let the range of the analog input signal carrying less information be quantized using a lower resolution. The data readout system 10 is, for example, an optical disc drive. The optical disc drive outputs a two level signal by detecting zero-crossing points of the input signal. Therefore, the resolution near zero-crossing points needs to be higher. The resistors disposed in an inner portion of the chain are designed to have resistance smaller than resistors disposed in an outer portion of the chain in order to provide smaller quantization levels near zero-crossing points and larger quantization levels in the outer region far from the zero-crossing points, as shown in FIG. 3. FIG. 3 illustrates a transfer function of a 7-bit ADC with non-uniform resolution according to this exemplary embodiment. Note that $n_1$ and $n_2$ in FIG. 2 represent scales of the resistance, and the values of $n_1$ and $n_2$ and the number of resistors having resistance equal to $n_1 R$ or $n_2 R$ depend on the design requirements of the system.

In this way, the number of the comparators 182 related to the outer region could be decreased and therefore the total number of the comparators 182 in the data readout system 10 is decreased. For example, a 7-bit ADC needs fewer than 127 comparators to produce a 7-bit digital output. The encoding module 184 is basically the same as a conventional encoder, with the difference being that a plurality of input nodes of the encoding module 184 may be coupled to the same comparator 182. This is because the number of the comparators is reduced. A better coupling relationship between the comparators 182 and the encoding module 184 is to couple the input nodes of the encoding module 184, which will be conventionally coupled to the omitted comparators, to the comparators near the omitted comparators. Because the inner circuit of the encoding module 184 is not changed, the bit length of the output code of the encoding module 184 is still 7-bits, but the category of the output code is less than 127, which depends on the number of the comparators 182. FIG. 4 illustrates a table showing an example of the output code of 7-bit ADC with and without nonlinear quantization characteristics.

Figure 5:
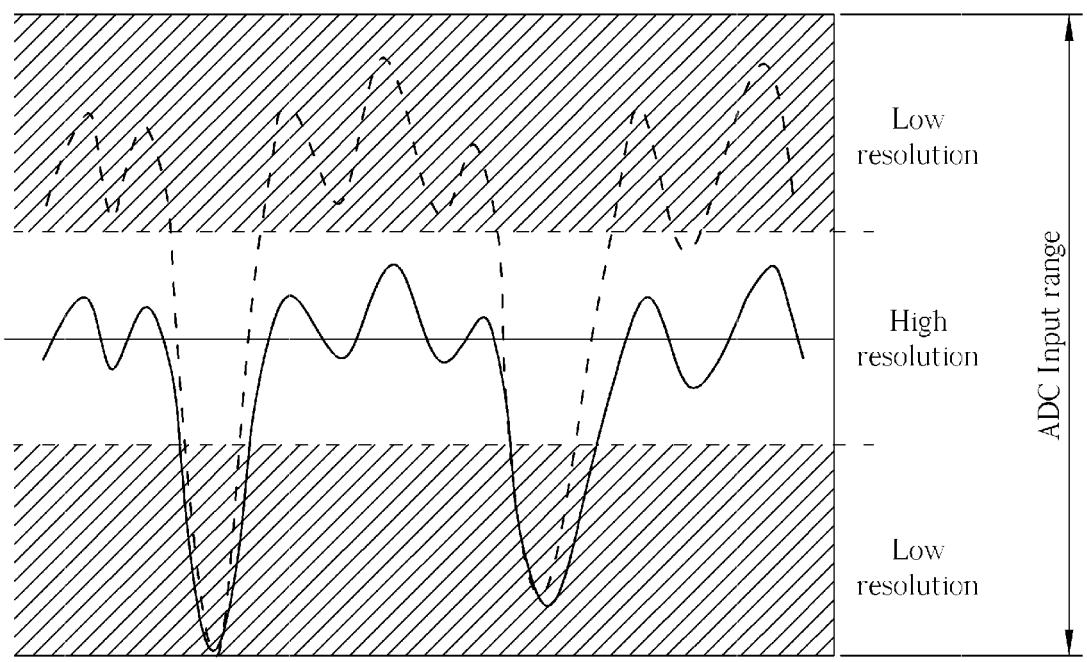
FIG. 5 illustrates the ADC input range before and after the signal adjustment.

Please refer to FIG. 5, because of the different characteristic of each storage device (e.g., an optical disc), the analog input signal (dotted line) read from accessing the storage device with the pick up head 12 may not always be symmetrical, which means the zero-crossing points of the analog input signal may not lie in the central range of the signal. Therefore, the zero-crossing points may not fall in the defined high resolution range of the ADC 18. If this situation occurs, the signal adjusting circuit 14 in FIG. 1 is utilized to adjust the gain or the offset of the analog input signal to make the zero-crossing points of the analog input signal substantially fall in the defined high resolution range (shown as the real line in FIG. 5).

Additionally, in one implementation, the transfer circuit 16 is a log filter having a log magnitude transfer characteristic and is utilized for amplifying the output of the signal adjusting circuit 14 to specially amplify the range around the zero-crossing points of the analog input signal. In this way, the quantization results of the ADC 18 will become more precise. Please note that the transfer circuit 16 is an optional component for the data readout system 10 shown in FIG. 1. That is, if the transfer circuit 16 is omitted, the data readout system 10 still benefits from using the ADC 18 with non-uniform resolution.

After the analog signal is converted into a digital signal by the ADC 18, the processor 20, such as a digital signal processor (DSP), processes the digital signal in order to decode the data contained in the digital signal and controls the signal adjusting circuit 14 and the transfer circuit 16 to adjust the analog input signal according to the digital signal processing result. Additionally, the processor 20 also adjusts the sampling clock of the ADC 18 according to the digital signal processing result to synchronize the sampling clock of the ADC 18 and the decoded data.

Figure 6:
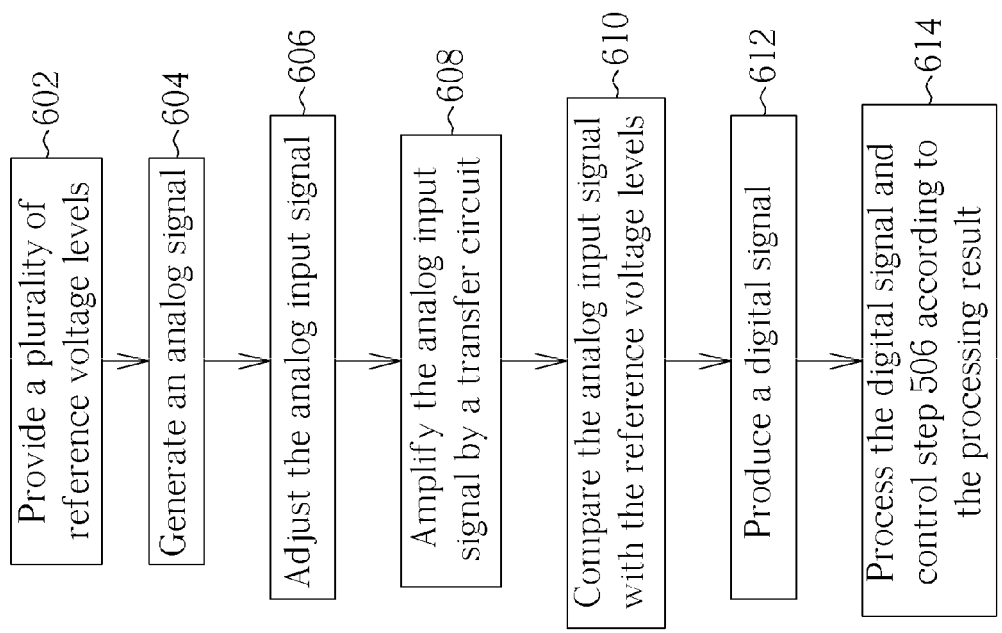
FIG. 6 is a flow chart showing the step of reading out data from a storage device according to an exemplary embodiment of the present invention.

As shown in FIG. 6, based on the above exemplary embodiment, the method for reading out data from a storage device comprises the following steps:

Step 602: Provide a plurality of reference voltage levels, arranged by voltage level in a chain, wherein voltage differences between two adjacent reference voltage levels are not all the same to thereby define at least a first range corresponding to a first conversion resolution and a second range corresponding to a second conversion resolution different from the first conversion resolution;

Step 604: Generate an analog input signal from accessing a storage device;

Step 606: Adjust the gain or the offset of the analog input signal to make at least a portion of the analog input signal fall in either the first range or the second range;

Step 608: Amplify the analog input signal with a transfer circuit having a non-linear magnitude transfer characteristic;

Step 610: Compare the analog input signal with the reference voltage levels to generate comparison results;

Step 612: Produce a digital signal according to the comparison results; and

Step 614: Process the digital signal and control step 606 of adjusting the analog input signal according to a digital signal processing result.

Since a skilled person can readily appreciate the operations of the steps shown in FIG. 6 after reading the above disclosure, further description is omitted here for the sake of brevity.

Figure 7:
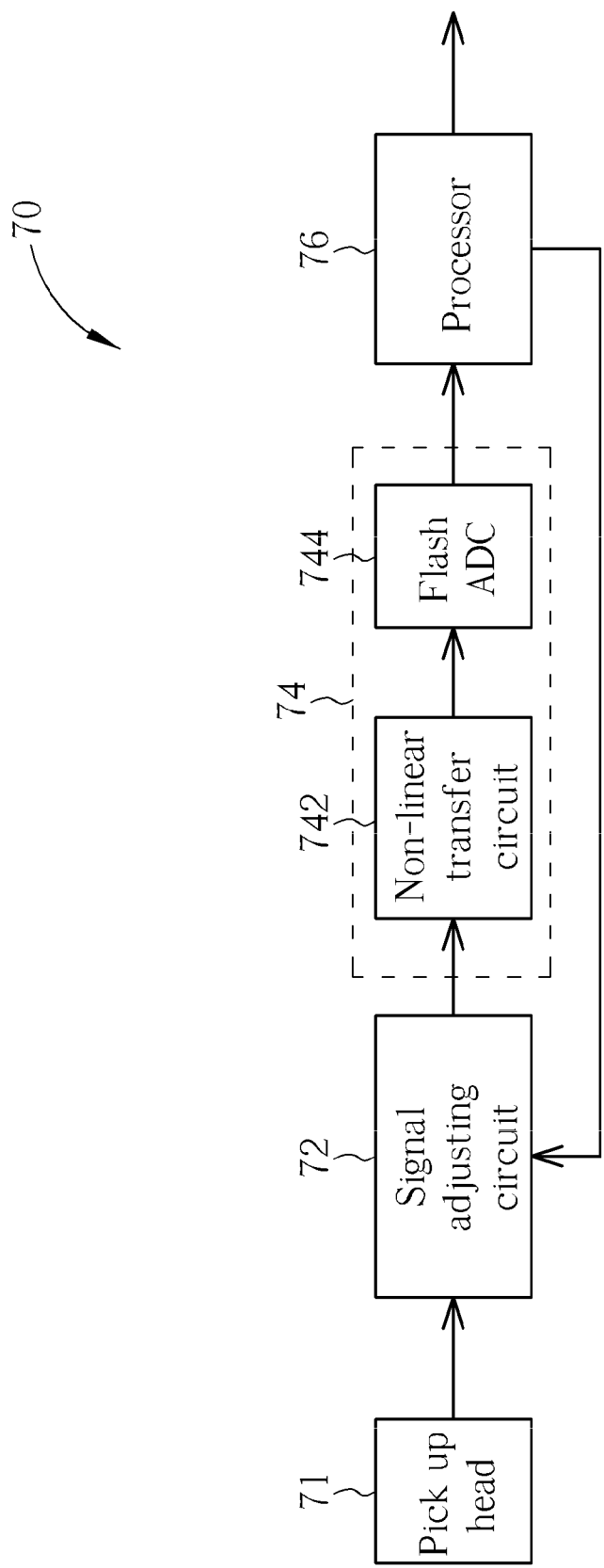
FIG. 7 is a diagram of a data readout system according to another exemplary embodiment of the present invention.

FIG. 7 shows another exemplary embodiment of the data readout system 70 with non-uniform resolution according to the present invention. As shown in FIG. 7, the data readout system 70 comprises a pick up head 71, a signal adjusting circuit 72, an analog-to-digital converting system 74, and a processor 76, wherein the analog-to-digital converting system 74 comprises a non-linear transfer circuit 742 having a non-linear magnitude transfer characteristic and a flash ADC 744. The pick up head 71, the signal adjusting circuit 72, the non-linear transfer circuit 742 of the analog-to-digital converting system 74 and the processor 76 in FIG. 7 are substantially the same as the pick up head 12, the signal adjusting circuit 14, the transfer circuit 16 and the processor 20 in FIG.

1, respectively. The major difference, however, is that the ADC in the first exemplary embodiment of the data readout system 10 shown in FIG. 1 is replaced by a conventional flash ADC 744, and the non-linear transfer circuit 742 is indispensable to the data readout system 70. Since the non-linear transfer circuit 742 has a non-linear magnitude transfer characteristic (e.g. the non-linear transfer circuit 742 is implemented by a log filter) defining at least a first input range corresponding to a first slope and a second input range corresponding to a second slope different from the first slope, the region carrying most information of the analog signal is adjusted by the signal adjusting circuit 72 to fall in either the first input region or the second region, depending on which has bigger the slope. Therefore, the region carrying most information of the analog signal is amplified, so the quantization operation of the conventional flash ADC 744 is equivalent to a non-linear quantization and the accuracy of analog-to-digital conversion of the analog-to-digital converting system 74 will be raised accordingly.

For example, when the data readout system 70 is an optical disc drive, the analog input signal is read by accessing an optical disc, and the non-linear transfer circuit 742 is designed to have a log magnitude transfer characteristic to amplify the region near zero-crossing points of the analog input signal. Although the quantization level of the conventional flash ADC 744 is identical, because the region near zero-crossing points is amplified due to the non-linear transfer circuit 742, the quantization results of this region become more sensitive than the quantization results of other regions, and therefore the decoding results of the following processor 66 can become more accurate.

Figure 8:
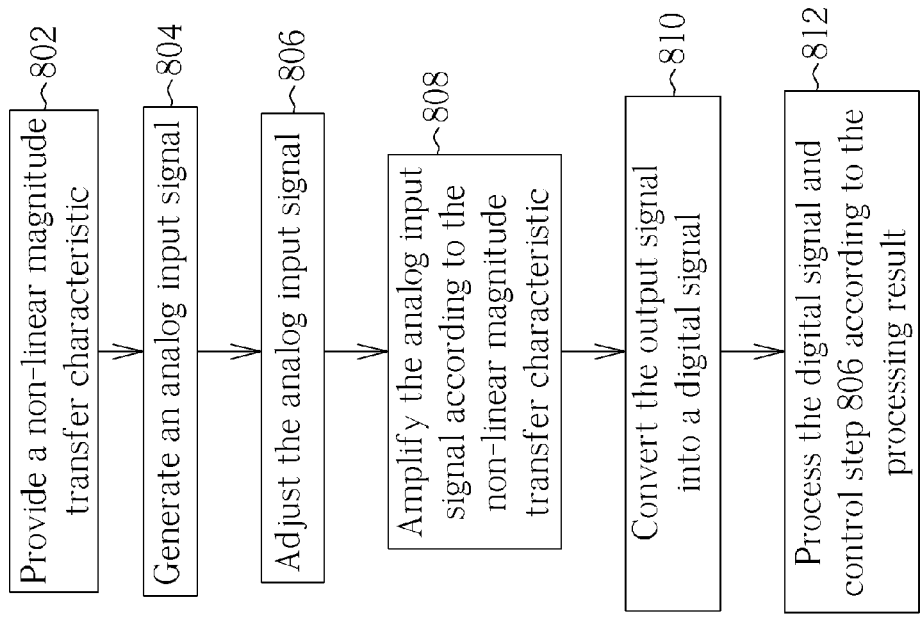
FIG. 8 is a flow chart showing the step of reading out data from a storage device according to another exemplary embodiment of the present invention.

FIG. 8 illustrates a flow chart for reading out data from a storage device based on the above exemplary embodiment. The method comprises following steps:

Step 802: Provide a non-linear magnitude transfer characteristic defining at least a first input range corresponding to a first slope and a second input range corresponding to a second slope different from the first slope;

Step 804: Generate an analog input signal from accessing a storage device;

Step 806: Adjust the gain or the offset of the analog input signal to make at least a portion of the analog input signal fall in either the first input range or the second input range;

Step 808: Amplify the analog input signal according to the non-linear magnitude transfer characteristic to generate an output signal;

Step 810: Convert the output signal into a digital signal; and

Step 812: Process the digital signal and control the step 806 of adjusting the analog input signal according to a digital signal processing result.

Since a skilled person can readily appreciate the operations of the steps shown in FIG. 8 after reading the above disclosure, further description is omitted here for the sake of brevity.

To conclude, the present invention utilizes non-linear quantization of the analog-to-digital conversion to make a data readout system contain fewer comparators while maintaining, or even improving the performance. Because the area of the comparators dominates the circuit size (chip size) of the data readout system, the present invention can successfully reduce the size of the system and the power consumption by the comparators.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An AD converter, comprising:
    a reference voltage unit comprising a series of impedance components for producing a plurality of reference voltage levels, wherein at least two of voltage differences of adjacent reference voltage levels are different, wherein the impedance components disposed in an inner portion of the series have impedance values smaller than the impedance components disposed in an outer portion of the series;
    a plurality of comparators for comparing the reference voltage levels with an analog input signal to generate comparison results; and
    an encoding module, coupled to the comparators, for producing a digital signal according to comparison results of the comparators; wherein the AD converter has a substantial linear transfer curve due to arrangement of the impedance components.

2. The AD converter of claim 1, wherein the AD converter is an N-bit ADC, a total number of the comparators is less than 2N−1, and at least one of the comparators is coupled to a plurality of input nodes of the encoding module.

3. The AD converter of claim 1, wherein the analog input signal is generated from accessing a storage device.

4. A data readout system for reading data stored in an optical disc through a pick up head, comprising:
    a reference voltage unit comprising a series of impedance components producing a plurality of reference voltage levels, wherein at least two of voltage differences of adjacent reference voltage levels are different, wherein the impedance components disposed in an inner portion of the series have impedance values smaller than the impedance components disposed in an outer portion of the series;
    a plurality of comparators for comparing the reference voltage levels with an analog signal from the pick up head and generating comparison results; and
    an encoding module for encoding the comparison results into a digital signal;
    wherein the data readout system has a substantial linear transfer curve due to arrangement of the impedance components.

5. The data readout system of claim 4, wherein at least one of the comparators is coupled to a plurality of input nodes of the encoding module.

6. The data readout system of claim 4, further comprising:
    a filter, coupled between the pick up head and the comparators, the filter having a non-linear magnitude transfer characteristic for transferring the analog signal into an output signal;
    wherein the comparators generate the comparison results according to the output signal of the filter.

7. A method for processing an analog input signal, the method comprising:
    providing a plurality of reference voltage levels generated by a series of impedance components, arranged by voltage level in a chain, wherein at least two of voltage differences of adjacent reference voltage levels are different, wherein the impedance components disposed in an inner portion of the series have impedance values smaller than the impedance components disposed in an outer portion of the series;
    comparing the analog input signal with the reference voltage levels to generate comparison results; and
    producing a digital signal by encoding the comparison results;

wherein a transfer curve between the analog input signal and the digital signal is substantially a linear transfer curve, due to arrangement of the impedance components.

8. The method of claim 7, wherein voltage differences of the reference voltage levels disposed in an inner portion of the chain are smaller than voltage differences of the reference voltage levels disposed in an outer portion of the chain.

9. The method of claim 7, further comprising a step of generating the analog input signal from accessing a storage device.

10. A method for reading out data, the method comprising:
providing a plurality of reference voltage levels generated by a series of impedance components, arranged by voltage level in a chain, wherein at least two of voltage differences of adjacent reference voltage levels are different to thereby define at least a first range corresponding to a first conversion resolution and a second range corresponding to a second conversion resolution different from the first conversion resolution, wherein the impedance components disposed in an inner portion of the series have impedance values smaller than the impedance components disposed in an outer portion of the series;
generating an analog input signal by accessing a storage device;
adjusting an analog input signal to make at least a portion of the analog input signal fall in either the first range or the second range;
comparing the analog input signal with the reference voltage levels to generate comparison results; and
producing a digital signal according to the comparison results, wherein the digital signal has a substantial linear relationship with the analog input signal.

11. The method of claim 10, further comprising:
processing the digital signal and controlling the step of adjusting the analog input signal according to a result of processing the digital signal.

12. The method of claim 10, wherein the step of adjusting the analog input signal comprises adjusting a gain or an offset of the analog input signal to make the portion of the analog input signal fall in either the first range or the second range.

13. The method of claim 10, wherein voltage differences of the reference voltage levels disposed in an inner portion of the chain are smaller than voltage differences of the reference voltage levels disposed in an outer portion of the chain.

14. The method of claim 10, wherein the portion of the analog input signal comprises zero-crossing points of the analog input signal.

15. The method of claim 10, wherein the storage device is an optical disc.

16. The method of claim 10, further comprising:
amplifying the analog input signal by a filter having a non-linear magnitude transfer characteristic.

17. The method of claim 16, wherein the filter is a log filter.

18. A data readout system for reading data stored in an optical disc through a pick up head, comprising:
a reference voltage unit for producing a plurality of reference voltage levels, wherein at least two of voltage differences of adjacent reference voltage levels are different, wherein the reference voltage unit is a resistor chain having different resistance values, wherein resistors disposed in an inner portion of the resistor chain have impedance values smaller than resistors disposed in an outer portion of the resistor chain;
a plurality of comparators for comparing the reference voltage levels with an analog signal from the pick up head and generating comparison results; and
an encoding module for encoding the comparison results into a digital signal, wherein the digital signal has a substantial linear relationship with the analog input signal;
wherein the different resistance values of the resistor chain enables the encoding module to have higher resolution for encoding the comparison results into the digital signal when the reading data has more information, and enables the encoding module has lower resolution for encoding the comparison results into the digital signal when the reading data has less information.

* * * * *